United States Patent
Lee et al.

(10) Patent No.: US 10,256,217 B2
(45) Date of Patent: Apr. 9, 2019

(54) LIGHT EMITTING DEVICE

(71) Applicant: TSLC CORPORATION, Hsinchu (TW)

(72) Inventors: Po-Wei Lee, Taipei (TW); C. Chu, Hsinchu (TW); Tzu-Han Lin, Zhubei (TW)

(73) Assignee: TSLC CORP., Hsinchu (TW)

( * ) Notice: Subject to any disclaimer, the term of this patent is extended or adjusted under 35 U.S.C. 154(b) by 0 days.

(21) Appl. No.: 15/607,563

(22) Filed: May 29, 2017

(65) Prior Publication Data
US 2018/0342486 A1    Nov. 29, 2018

(51) Int. Cl.
| | | |
|---|---|---|
| H01L 25/00 | (2006.01) | |
| H01L 33/50 | (2010.01) | |
| H01L 33/54 | (2010.01) | |
| H01L 33/56 | (2010.01) | |
| H01L 25/075 | (2006.01) | |

(52) U.S. Cl.
CPC .......... *H01L 25/0753* (2013.01); *H01L 25/50* (2013.01); *H01L 33/50* (2013.01); *H01L 33/54* (2013.01); *H01L 33/56* (2013.01)

(58) Field of Classification Search
CPC ..... H01L 51/56; H01L 33/32; H01L 51/5012; H01L 51/5056; C09K 11/06
USPC .......................................................... 257/89
See application file for complete search history.

(56) References Cited

U.S. PATENT DOCUMENTS

| | | |
|---|---|---|
| 4,950,942 A | 8/1990 | Braun et al. |
| 8,434,883 B2 | 5/2013 | Doan et al. |
| 8,905,609 B2 | 12/2014 | Tessnow et al. |
| 9,651,214 B2 | 5/2017 | Lee et al. |
| 2002/0145883 A1 | 10/2002 | Akizuki |
| 2011/0127912 A1 | 6/2011 | Lee |
| 2013/0313580 A1* | 11/2013 | Wan ........................ H01L 33/56 257/88 |
| 2014/0328079 A1 | 11/2014 | Itagaki |
| 2015/0340574 A1* | 11/2015 | Tamaki ................. H01L 33/505 257/98 |
| 2016/0319999 A1 | 11/2016 | Elzinger |

* cited by examiner

*Primary Examiner* — Andy Huynh
(74) *Attorney, Agent, or Firm* — Stephen A. Gratton

(57) ABSTRACT

A light emitting device includes a circuitry substrate and multiple light emitting diodes (LEDs) bonded to the circuitry substrate in a spaced array. The light emitting device also includes a continuous and substantially flat wavelength conversion member covering the light emitting diodes (LEDs) configured to convert the electromagnetic radiation emitted by the light emitting diodes (LEDs) into another wavelength range. The light emitting device also includes a planarized layer configured to support the wavelength conversion member on the circuitry substrate. The light emitting device can also include a light shaper on the wavelength conversion member configured to form emitting windows for the electromagnetic radiation transmitted through the wavelength conversion member forming an output light beam having a desired emitting window size, shape, and edge and to block and minimize scattered electromagnetic radiation from the wavelength conversion layer.

13 Claims, 19 Drawing Sheets

LIGHT EMITTING DEVICE

BACKGROUND

This disclosure relates generally to optoelectronic devices and more particularly to a light emitting device having two or more light emitting diodes (LEDs), a planarized layer, a continuous wavelength conversion member and a light shaper. This disclosure also relates to a method for fabricating the light emitting device.

Light emitting devices containing light emitting diodes (LEDs) have been developed that are interchangeable with conventional light bulbs having incandescent and fluorescent light sources in lighting systems. In various applications, light emitting devices can include two or more light emitting diodes (LEDs) on a circuitry substrate configured to form a light beam. One shortcoming of this type of light emitting device is that the light beam can have a non uniform light intensity and color across its width.

Referring to FIG. 1, a prior art light emitting device 10A includes a circuitry substrate 12A and four spaced light emitting diodes (LEDs) 14A in a spaced array. Each light emitting diode (LED) 14A includes a separate wavelength conversion member. This configuration produces a discontinuous light intensity and light output. As shown in FIG. 2, the light emitting device 10A produces a luminance pattern 16A comprised of the individual light outputs of the light emitting diodes (LEDs) 14A and individual wavelength conversion members, with the highest light outputs of the light emitting diodes (LEDs) 14A represented by the four peaks. As also shown in FIG. 2, due to the spacing of the light emitting diodes (LEDs) 14A and discontinuous wavelength conversion members, there are gaps in the light density of the luminance pattern 16A. These gaps form undesirable shadows in the application side. For example, in an automotive head lighting system, the gaps can form dark spots during operation of a vehicle at night.

Referring to FIG. 3, a prior art of light emitting device 10B includes a circuitry substrate 12B and four light emitting diodes (LEDs) 14B mounted to the circuitry substrate 12B. In addition, electrical connection wires 17B, which are encapsulated in an optional wire protection material 18B, electrically connect the light emitting diodes (LEDs) 14B to electrodes on the circuitry substrate 12B. Each light emitting diode (LED) 14B includes a separate wavelength conversion member 15B, which are discontinuous and spaced from one another. The discontinuous wavelength conversion members 15B along with the wire protection material 18B form dark areas DA and bright areas BA, and a non-uniform brightness and color across the emitting surface of the light emitting device 10B. One shortcoming of this type of light emitting device 10B is that resultant light beam can also have a non uniform light intensity across its surface area.

Referring to FIG. 4, another prior art light emitting device 10C includes a circuitry substrate 12C and four light emitting diodes (LEDs) 14C mounted to the circuitry substrate 12C using wires 17C and an optional wire protection material 18C as previously described. The light emitting device 10C also includes wavelength conversion members 15C formed on light emitting diodes (LEDs) 14C using a phosphor spray coating process. As with the previous light emitting device 10B, the wavelength conversion members 15C have non-uniform thicknesses, and non planar surfaces across the surface area of the light emitting device 10C. Again this configuration can produce a non uniform light intensity as well as dark areas and bright areas.

Referring to FIG. 5, another prior art light emitting device 10D includes a circuitry substrate 12D and four flip chip light emitting diodes (LEDs) 14D bonded to the circuitry substrate 12D. Each flip chip light emitting diode (LED) 14D includes a p-electrode and an n-electrode bonded to corresponding electrodes on the circuitry substrate 12D. The light emitting device 10D also includes a wavelength conversion member 15D enclosed by a dam 13D both of which are formed using a dispensing process. In this type of light emitting device 10D large color differences can occur due to side emitting and center emitting from the light emitting diodes (LEDs) 14D. For example, the path of a side light beam S passing though the wavelength conversion member 15D is longer than the path of a center light beam C. In the side light beam S more photons are converted by the wavelength conversion member 15D producing color differences relative to the center light beam C, such as yellowish side emitting or color shifting side emitting. This configuration does not produce an ideal color uniformity. In addition, the wavelength conversion member 15D, which is formed using a dispensing process, typically has a non-uniform thickness and planarity, which also contributes to non-uniformity in brightness and color.

Referring to FIG. 6, another prior art light emitting device 10E includes a circuitry substrate 12E and four flip chip light emitting diodes (LEDs) 14E bonded to the circuitry substrate 12E. The light emitting device 10E also includes a wavelength conversion member 15E formed on the light emitting diodes (LEDs) 14E using a phosphor spray coating process. In this embodiment, there are gaps between the light emitting diodes 14E, which are filled by a protection or reflection material 11E to reduce the color shifting from side emitting. However, the intensity brightness cannot be uniform due to light blocking by the protection or reflection material 11E.

Referring to FIG. 7, another prior art light emitting device 10F includes a circuitry substrate 12F and four white light emitting diodes (LEDs) 14F bonded to the circuitry substrate 12F. Each light emitting diode (LED) 14F includes a p electrode, an n electrode, a side wall w, and wavelength conversion member 15F. There are the gaps between the white light emitting diodes (LEDs) 14F and a light beam produced by the light emitting device 10F can have a non uniform light intensity and color across its width.

In view of the foregoing, there is a need in the art for a light emitting device that produces a light beam having a uniform color and light intensity across its width. The present disclosure is directed to a light emitting device having a uniform brightness and definition and to a method for fabricating the light emitting device.

SUMMARY

A light emitting device includes a circuitry substrate having electrodes and terminal contacts in a selected configuration in electrical communication with one another. The light emitting device also includes two or more flip chip light emitting diodes (FCLEDs) bonded to the electrodes on the circuitry substrate in a spaced array having coplanar top surfaces configured to emit electromagnetic radiation having a selected wavelength range.

The light emitting device also includes a continuous and substantially planar wavelength conversion member covering the flip chip light emitting diodes (FCLEDs) configured to convert the electromagnetic radiation emitted by the flip chip light emitting diodes (FCLEDs) into another wavelength range. For example, the light emitting diodes can be configured to emit electromagnetic radiation in the blue spectral range, and the wavelength conversion member can include a layer containing a phosphor compound for converting some of this radiation to a yellow spectral range producing an output light beam that appears to be white light.

The light emitting device also includes a planarized layer configured to support the wavelength conversion member on the circuitry substrate. The planarized layer has a planar support surface that is coplanar to the top surfaces of the light emitting diodes (LEDs) and parallel to the major planar surfaces of the wavelength conversion member. With this geometry, all of the electromagnetic radiation emitted by the light emitting diodes (LEDs) is uniformly transmitted through the wavelength conversion member and exits the wavelength conversion member along substantially the same plane.

The light emitting device can also include a light shaper on the wavelength conversion member configured to form emitting windows for the electromagnetic radiation transmitted through the wavelength conversion member forming an output light beam having a desired emitting windows size, shape and sharp edges. In addition, the light shaper is configured to block and minimize scattered electromagnetic radiation from the wavelength conversion layer, which reduces the non-uniformity of color produced by big angle side emission.

A method for fabricating the light emitting device includes the steps of: providing a circuitry substrate having a plurality of electrodes in a desired pattern; providing a plurality of light emitting diodes (LEDs) configured to emit electromagnetic radiation having a selected wavelength range; bonding the light emitting diodes (LEDs) to the electrodes on the circuitry substrate with top surfaces of the light emitting diodes (LEDs) coplanar; forming a planarized layer on the circuitry substrate having a planar support surface that is coplanar to the top surfaces of the light emitting diodes (LEDs); forming a continuous wavelength conversion member on the planar support surface of the planarized layer covering the light emitting diodes (LEDs) and having major planar surfaces parallel to the planar support surface; and forming a light shaper on the wavelength conversion member configured to form emitting windows for the electromagnetic radiation transmitted through the wavelength conversion member forming an output light beam having a desired emitting windows size, shape, and edge and to block and minimize scattered electromagnetic radiation from the wavelength conversion layer.

BRIEF DESCRIPTION OF THE DRAWINGS

Exemplary embodiments are illustrated in the referenced figures of the drawings. It is intended that the embodiments and the figures disclosed herein are to be considered illustrative rather than limiting.

DETAILED DESCRIPTION

Figure 8:
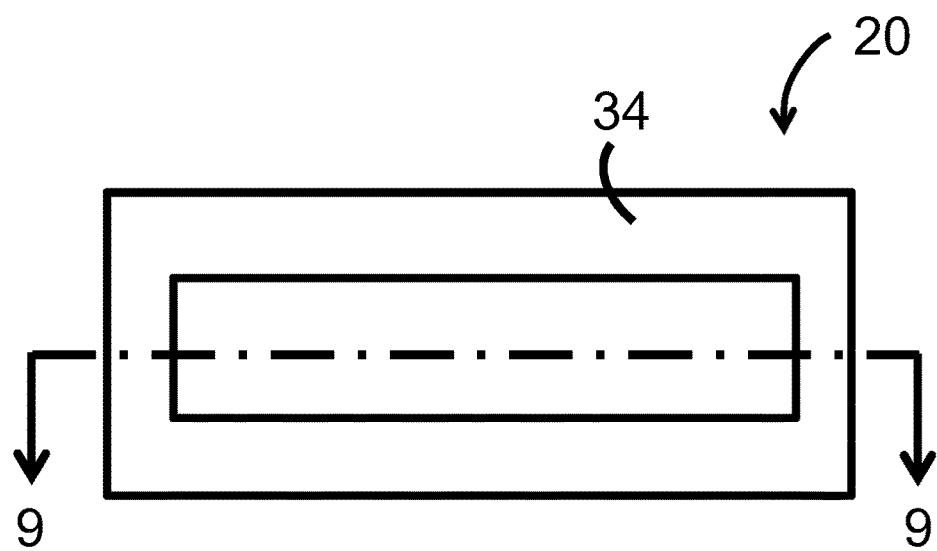
FIG. 8 is a schematic plan view of a light emitting device constructed in accordance with the present disclosure.
Figure 9:
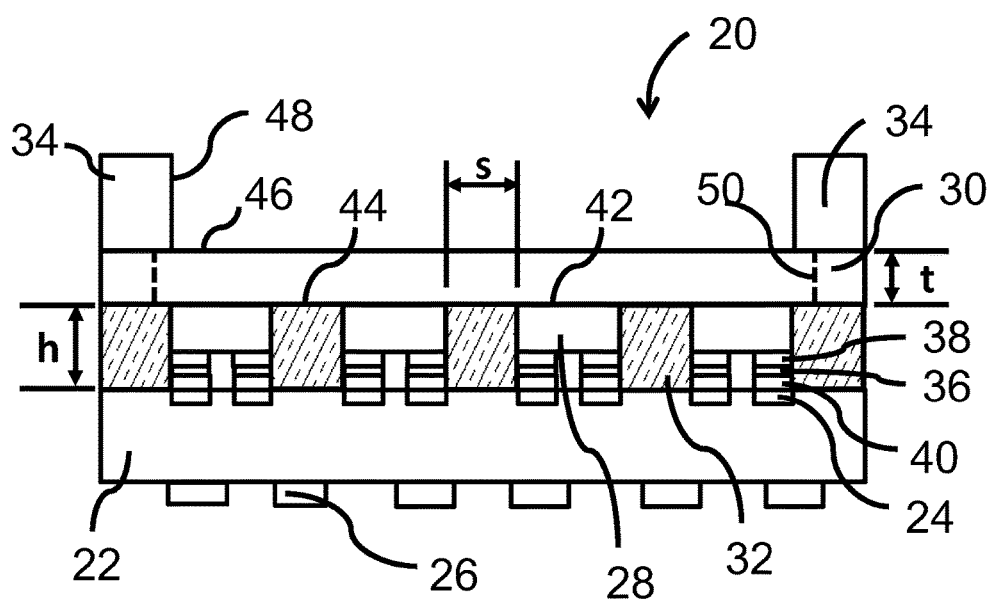
FIG. 9 is a schematic cross sectional view of the light emitting device taken along section line 9-9 of FIG. 8.

Referring to FIGS. 8 and 9, a light emitting device 20 includes a circuitry substrate 22 having a plurality of electrodes 24 in a desired pattern and terminal contacts 26 in a desired configuration. The light emitting device 20 also includes two or more light emitting diodes (LEDs) 28 bonded to the electrodes 24 on the circuitry substrate 22 in a spaced array configured to emit electromagnetic radiation having a desired wavelength range. The light emitting device 20 also includes a wavelength conversion member 30 covering the light emitting diodes (LEDs) 28 configured to convert the electromagnetic radiation emitted by the light emitting diodes (LEDs) 28 into a desired wavelength. The light emitting device 20 also includes a planarized layer 32 configured to support the wavelength conversion member 30 on the circuitry substrate 22 with a desired height and planarity relative to the light emitting diodes (LEDs) 28. The light emitting device 20 also includes a light shaper 34 on the wavelength conversion member 30 configured to shape the electromagnetic radiation emitted by the light emitting diodes (LEDs) 28 into a light beam having a desired shape.

The circuitry substrate 22 functions as a mounting substrate for the light emitting diodes (LEDs) 28. The circuitry substrate 22 includes the electrodes 24 which have geometry suitable for bonding to the light emitting diodes (LEDs) 28. The circuitry substrate 22 also includes electrical and heat conductors (not shown) for electrically and thermally connecting the electrodes 24 to the terminal contacts 26. The terminal contacts 26 can comprise pins, pads or other suitable electrical and thermal connectors, for electrically connecting the light emitting device 20 to a mating receptacle, such as one on an automotive lighting system. In addition, the circuitry substrate 22 can include a reflective layer (not shown) to improve light extraction. The circuitry substrate 22 can comprise a ceramic material, sapphire, glass, a printed circuit board (PCB) material, a metal core printed circuit board (MCPCB), an FR-4 printed circuit board (PCB), a metal lead frame, an organic lead frame, a silicone submount substrate, a semiconductor material or any packaging substrate used in the art. Further, the circuitry substrate 22 can comprise a single layer of metal or metal alloy layers, or multiple layers such as Si, AlN, SiC, AlSiC, diamond, MMC, graphite, Al, Cu, Ni, Fe, Mo, CuW, CuMo, copper oxide, sapphire, glass, ceramic, metal or metal alloy. In addition, the circuitry substrate 22 can have any polygonal shape (e.g., square, rectangular) and any suitable size. Further, the circuitry substrate 22 can have a desired thickness, with from 100 µm to 2000 µm being representative. The circuitry substrate 22 can be configured such that the light emitting device 20 is configured as a module suitable for mounting on a PCB/MCPCB board using solder paste, silver paste, nanosilver paste, eutectic metal alloy using surface mount techniques (SMT), reflowed to make suitable connection. The circuitry substrate 22 can also be configured such that the light emitting device 20 is configured as a module suitable for mounting on a PCB/MCPCB board using solder paste, nanosilver paste, surface mount techniques (SMT), refowed to make suitable connection or a suitable connector. The circuitry substrate 22 edges could be covered completely with the planarized layer 32.

The light emitting device 20 can include any number of light emitting diodes (LEDs) 28 greater than two (e.g., 2-10), which can be configured to form a linear array or matrix light source. For illustrative purposes, the light emitting device 20 includes four light emitting diode (LEDs) 28. Each light emitting diode (LED) 28 can comprise a conventional flip chip (FCLED), such as a vertical light emitting diode (VLED) die, configured to emit electromagnetic radiation over a selected wavelength range. Rather than a flip chip device other types of devices having flat top surfaces and p/n electrodes on the bottom side can also be used to construct the light emitting device 20. In addition, each light emitting diode (LED) 28 can be configured to emit electromagnetic radiation from the visible spectral region (e.g., 400-770 nm), the violet-indigo spectral region (e.g., 400-450 nm), the blue spectral region (e.g., 450-490 nm), the green spectral region (e.g., 490-560 nm), the yellow spectral region (e.g., 560-590 nm), the orange spectral region (e.g., 590-635 nm) or the red spectral region (e.g., 635-700 nm) or the infrared regions (e.g., <700 nm) or ultraviolet regions (e.g. 250 nm-400 nm). However, these wavelength ranges are merely exemplary. Suitable light emitting diode (LED) dice are commercially available from Epistar, Cree, Nichia, SemiLEDS Optoelectronics Co. Ltd., located in Miao-Li County, Taiwan, R.O.C.

Each light emitting diode (LED) 28 includes die contacts 36 and a die contact bonding layer 38. In addition, the die contacts 36 can be bonded to the electrodes 24 on the circuitry substrate 22 using a suitable die attach layer 40 such as eutectic solder, silver epoxy or another polymer. A spacing "s" between the light emitting diodes (LEDs) 28 can be from 1 µm to 150 µm with the preferred range between 5 µm to 100 µm. In addition, the light emitting diodes (LEDs) 28 are mounted to the circuitry substrate 22 such that the planar top surfaces 42 of the light emitting diodes (LEDs) 28 are coplanar to one another.

The planarized layer 32 is formed into and over the spaces between the light emitting diodes (LEDs) 28 and extends to the outside periphery of the circuitry substrate 22. FIG. 8 shows the peripheral shape of the planarized layer 32. A height "h" of the planarized layer 32 matches the height of the light emitting diodes (LEDs) 28 measured from the surface of the circuitry substrate 22. In addition, the planarized layer 32 has a planar support surface 44 that is substantially parallel to the planar top surfaces 42 of the light emitting diodes (LEDs) 28. The geometry of the planarized layer 32 provides a base for the wavelength conversion member 30 so that all of the electromagnetic radiation emitted by the light emitting diodes (LEDs) 28 passes through the same uniform thickness "t" of the wavelength conversion member 30. In addition, the electromagnetic radiation transmitted through the wavelength conversion member 30 exits along the same plane.

The planarized layer 32 can be formed of a curable polymer material that is deposited in viscous form on the circuit substrate 22 and then cured with the planar support surface 44 using a mold or other suitable tool. The planarized layer 32 could be applied using various techniques such as spraying, printing, screen printing, squeeze or chemically deposited; The planarized layer 32 could be subjected to further curing steps by applying heat or photon radiation. Optionally, a planarization process can also be performed to form the planar support surface 44 using a process such as chemical mechanical planarization (CMP), polishing, grinding or mechanical means; the planarization process could be done in a liquid or slurry containing medium forming a liquid environment. Suitable materials for the planarized layer 32 include powder mixed polymers, such as $TiO_2$, $SiO_2$, $Al_2O_3$, $Ta_2O_5$, C, MgO, and insulation coated materials. Other suitable materials for the planarized layer 32 include silicone, epoxy, gel, glue, photo-sensitive resist, and non-photosensitive resist. The material for the planarized layer 32 can be selected such that the planarized layer 32 reflects at least some of the electromagnetic radiation emitted by the light emitting diodes (LEDs) 28. However, depending on the application, the planarized layer 32 can alternately be constructed of a material that absorbs or reflects the electromagnetic radiation emitted by the light emitting diodes (LEDs) 28 so that the electromagnetic radiation emitted by one LED would not interfere with the adjacent LED/LEDs.

The wavelength conversion member 30 includes a material configured to convert at least some of the electromagnetic radiation emitted by the light emitting diodes (LEDs) 28 into electromagnetic radiation having a different wavelength range. The wavelength conversion member 30 can include a material configured to convert the electromagnetic radiation emitted by the light emitting diodes (LEDs) 28 into electromagnetic radiation having a higher wavelength. For example, if the light emitting diodes (LEDs) 28 emit electromagnetic radiation in a blue spectral range, the wavelength conversion member 30 can include a phosphor compound or a mixture of phosphor compounds for converting some of this radiation to a desired spectral range. A representative thickness "t" of the wavelength conversion member 30 should be greater than 5 µm but less than about 200 µm, with the preferred range between 10 µm to 100 µm. In addition, the wavelength conversion member 30 is formed such that the thickness "t" is substantially uniform throughout the entire cross section of the wavelength conversion member 30. In addition, the wavelength conversion member 30 has a planar inner major surface and a planar outer major surface that are substantially parallel to one another. The wavelength conversion member 30 could be applied using various techniques such as spraying, printing, screen printing, squeeze, dispensing or chemically deposited. The wavelength conversion member 30 could be subjected to further curing steps by applying heat or photon radiation.

The wavelength conversion member 30 can include a layer comprised of a wavelength conversion material, such as a phosphor compound or quantum dots, deposited on a polymer base material, such as silicone, epoxy, gel, glue, photosensitive resist, non-photosensitive resist, glass or an adhesive polymer. As another example, the wavelength conversion member 30 can comprise a polymer base material, as described above, containing a wavelength conversion material.

The light shaper 34 is formed on the planar outer major surface 46 of the wavelength conversion member 30 and is configured to shape the electromagnetic radiation emitted by the light emitting diodes (LEDs) 28 into an output light beam having a desired shape. As shown in FIG. 8, the light shaper 34 can have a picture frame shape with inside edges 48 (FIG. 9) configured to shape the electromagnetic radiation into a generally rectangular output light beam. Alternately, the light shaper 34 can be configured to shape the output beam into other geometrical shapes, such as circular or oval. In addition to shaping the electromagnetic radiation, the inside edges 48 of the light shaper 34 can be positioned to block the electromagnetic radiation scattering from a designed edge 50 of the wavelength conversion member 30 thus minimizing the edge emissive effect. The designed edge 50 is inside the inside edges 48 of the light shaper 34 so that it is covered by the light shaper 34. The light shaper 34 can be formed of a light reflective material or a light absorption material (e.g., white or black) depending on the application.

The light shaper 34 can be formed of a curable polymer material that is deposited in viscous form on the wavelength conversion member 30 and then cured. Suitable materials for the planarized layer 32 include powders or particles mixed polymers, such as $TiO_2$ mixed silicone, $TiO_2$ mixed epoxy, $TiO_2$ mixed gel, $TiO_2$ mixed glue, $SiO_2$ mixed silicone, $SiO_2$ mixed epoxy, $SiO_2$ mixed gel, $SiO_2$ mixed glue, carbon mixed silicone, carbon mixed epoxy, carbon mixed gel, carbon mixed glue, Tungsten powder mixed silicone, Titanium mix silicone, $Al_2O_3$ and Titanium oxide mixed silicone, $Al_2O_3$ mixed silicone, $Al_2O_3$ mixed epoxy, $Al_2O_3$ mixed gel, $Al_2O_3$ mixed glue, $Ta_2O_5$ mixed silicone, $Ta_2O_5$ mixed epoxy, $Ta_2O_5$ mixed gel, and $Al_2O_3$ mixed glue. The light shaper 34 could be applied using various techniques such as spraying, printing, screen printing, squeeze or chemically deposited. The light shaper 34 could be subjected to further curing steps by applying heat or photon radiation.

Figure 1:
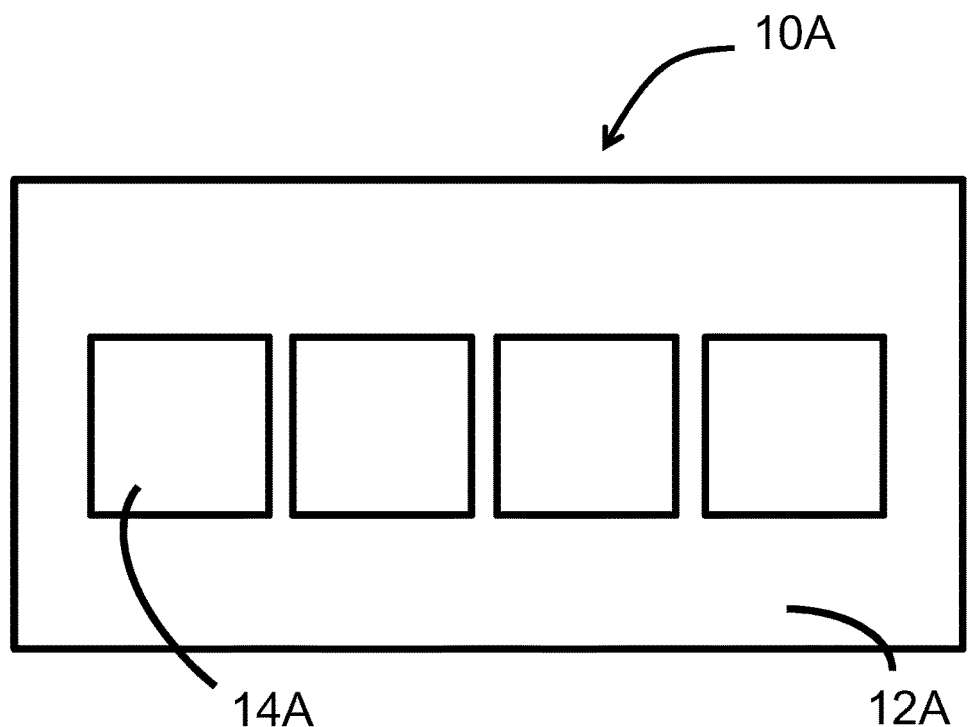
FIG. 1 is a schematic plan view of a prior art light emitting device.
Figure 2:
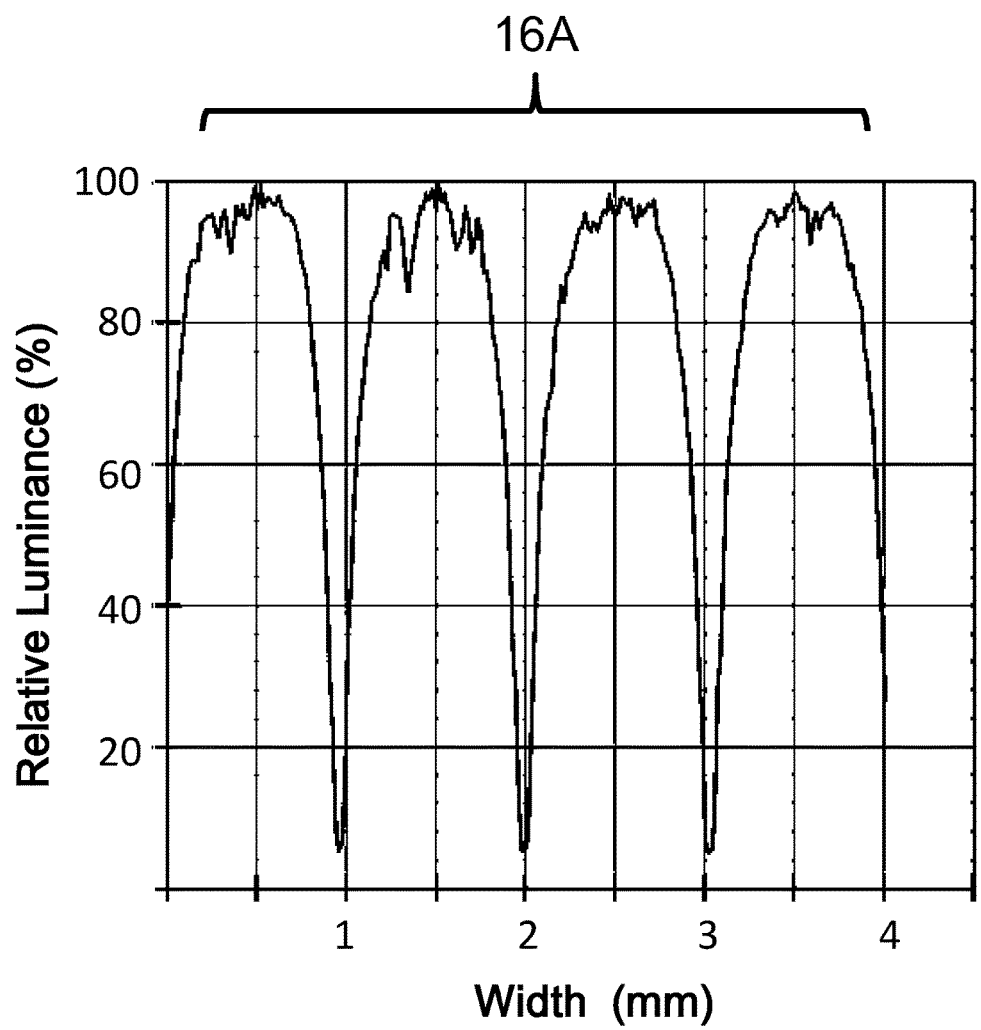
FIG. 2 is a luminance graph showing a light beam produced by the prior art light emitting device with the x-axis representing the width of the beam in mm and the y-axis representing the relative light luminance of the beam by %.
Figure 3:
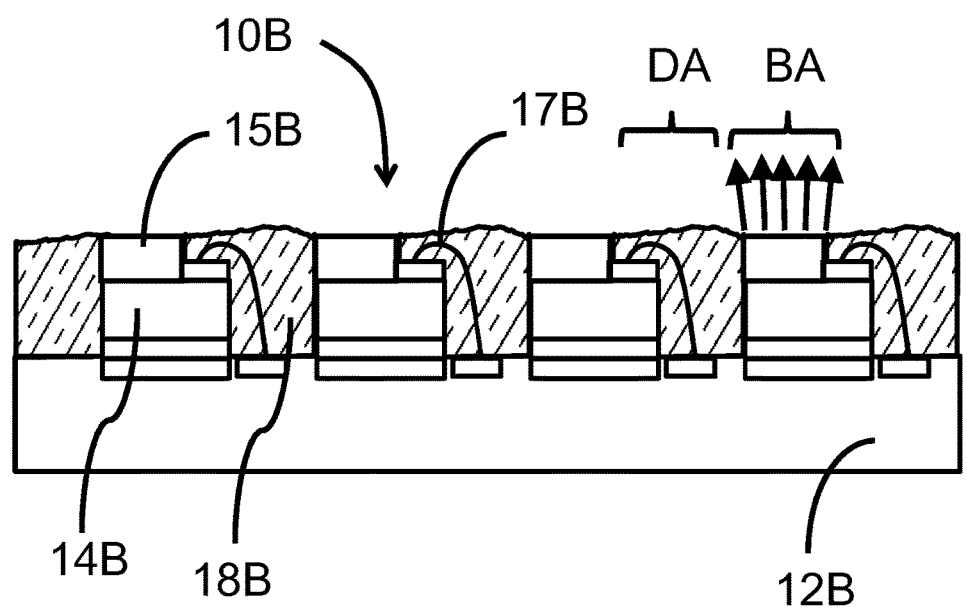
FIG. 3 is a schematic cross sectional view of a prior art light emitting device.
Figure 4:
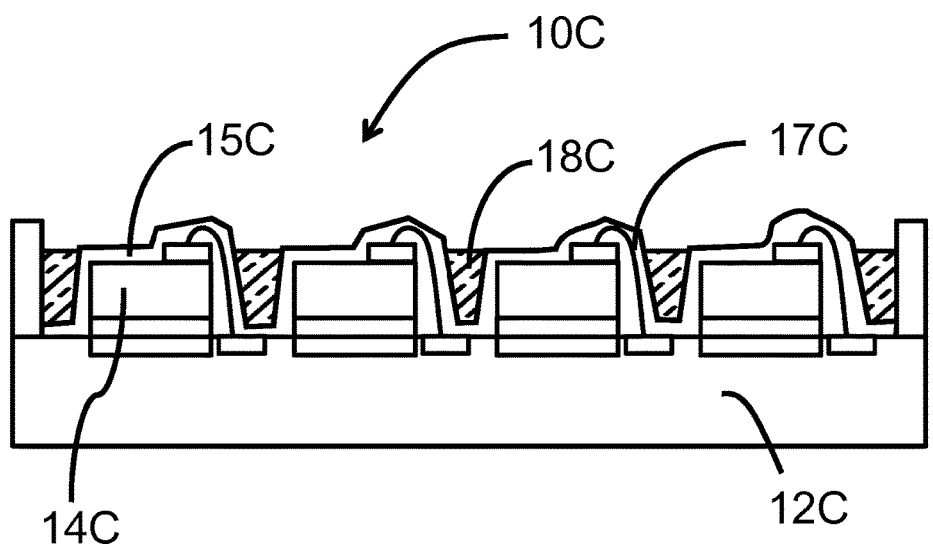
FIG. 4 is a schematic cross sectional view of a prior art light emitting device.
Figure 5:
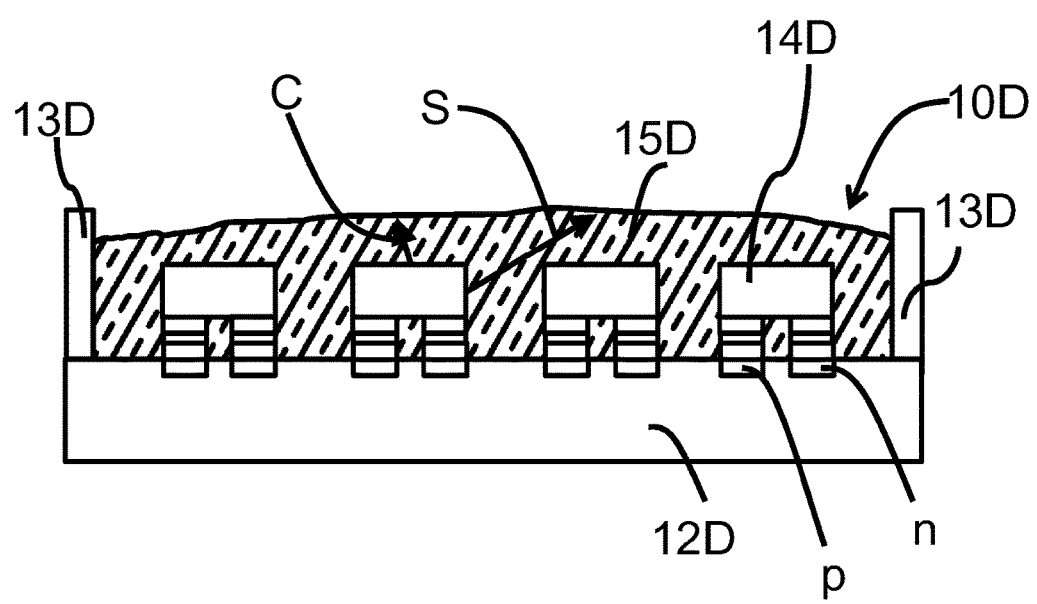
FIG. 5 is a schematic cross sectional view of a prior art light emitting device.
Figure 6:
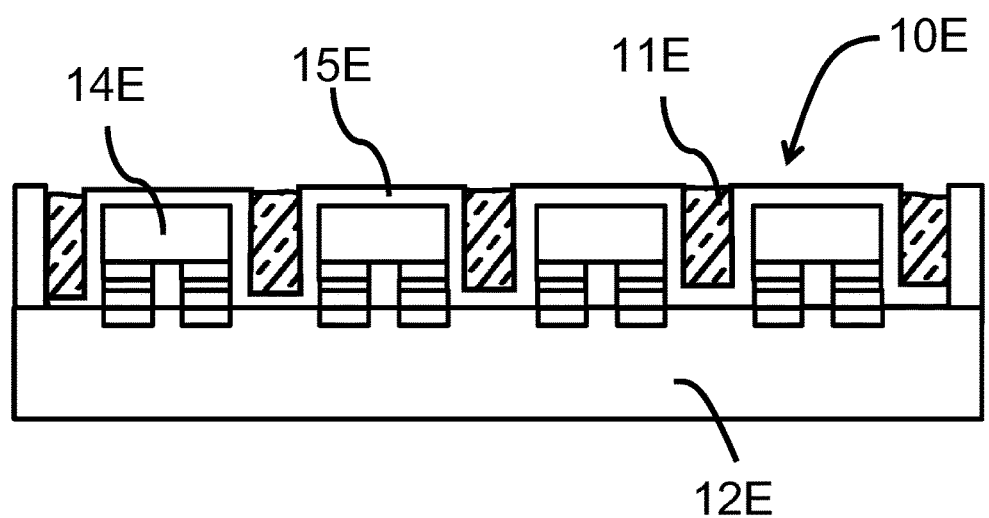
FIG. 6 is a schematic cross sectional view of a prior art light emitting device.
Figure 7:
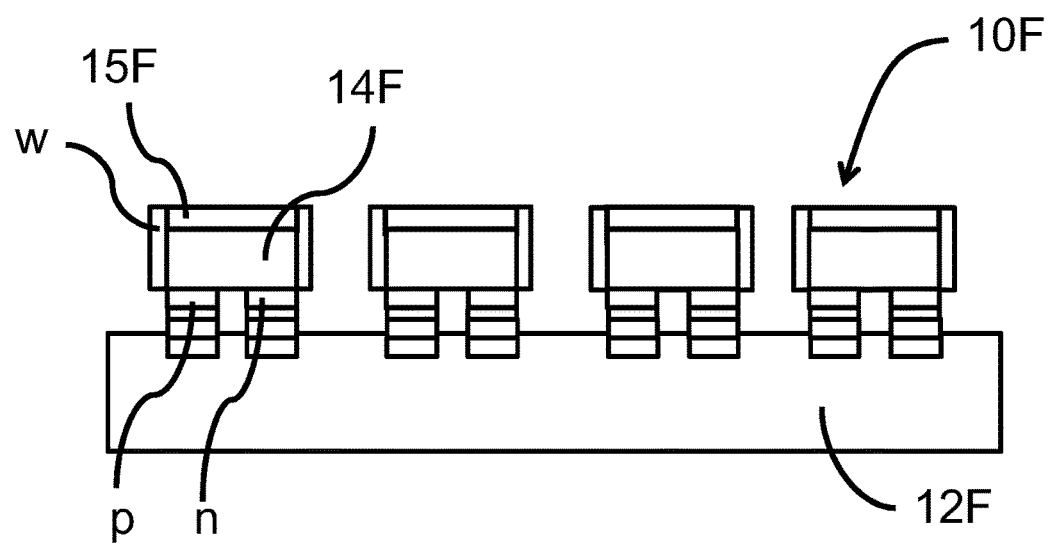
FIG. 7 is a schematic cross sectional view of a prior art light emitting device.
Figure 10:
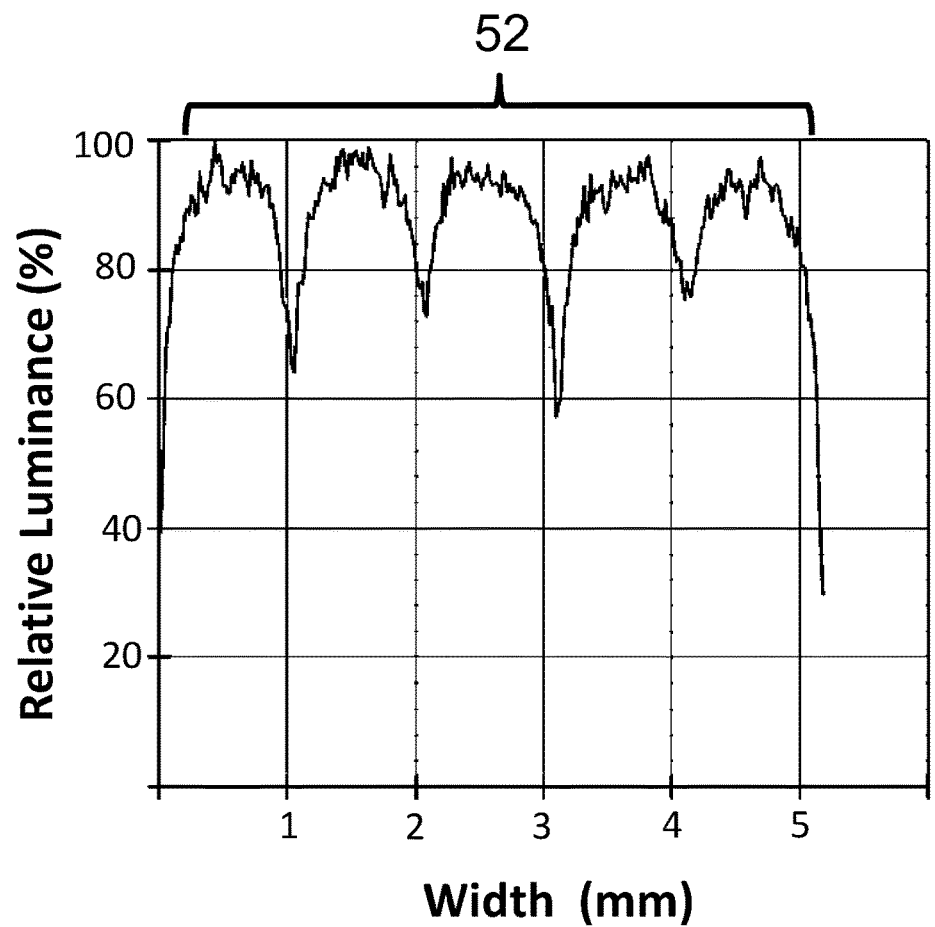
FIG. 10 is a luminance graph showing a light beam produced by the light emitting device of the present disclosure with the x-axis representing the width of the beam in mm and the y-axis representing the relative light luminance of the beam by %.

Referring to FIG. 10, further characteristics of the light emitting device 20 are illustrated. In FIG. 10, the luminance pattern 52 of the output light beam has a total light intensity characterized by four peaks corresponding to the four light emitting diodes (LEDs) 28. However, the gaps between the peaks are smaller than in the prior art luminance pattern 16A (FIG. 2) for its output light beam. By optimizing the space "s", the gaps between the peaks could be optimized to the needed level for the required application. In addition, the intensity of the luminance pattern 52 is substantially uniform across the width of the output light beam as the low points of the gaps are closer to the peaks than in the prior art luminance pattern 16A (FIG. 2).

Figure 11:
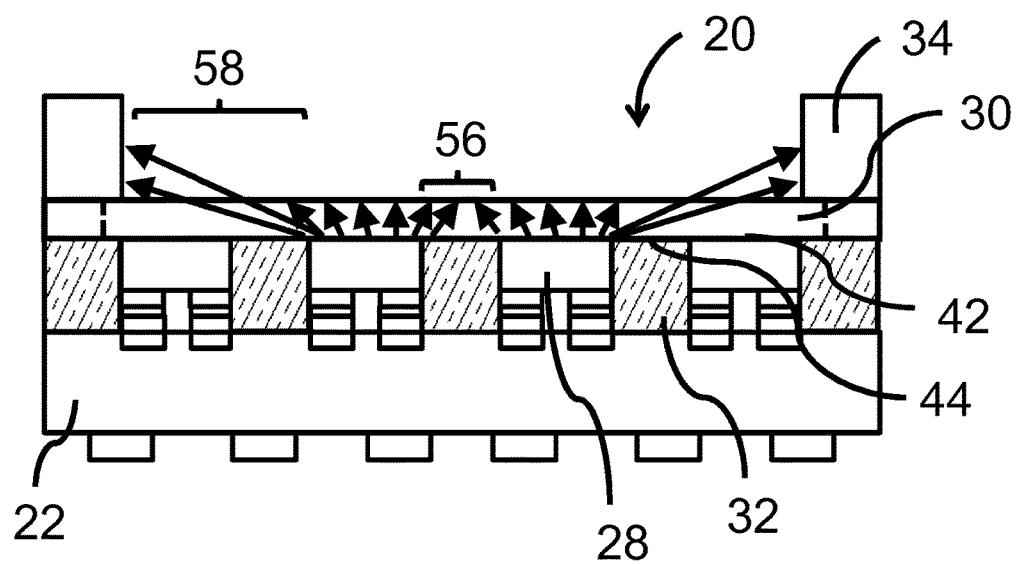
FIG. 11 is a schematic cross sectional view illustrating operational characteristics of a light emitting device constructed in accordance with the present disclosure.

Referring to FIG. 11, further characteristics of the light emitting device 20 are illustrated. Each light emitting diode (LED) 28 can comprise a conventional flip chip (FCLED) bonded to the circuitry substrate 22 using flip chip bonding. Other types of LEDs could also be used such as horizontal LED chips with both electrodes bonded to the circuit substrate 22. The light emitting device 20 includes the planarized layer 32 that is co-planner to the top surfaces 42 of the light emitting diodes (LEDs) 28. With the planar base provided by the planarized layer 32, the wavelength conversion member 30 can be uniformly coated and attached on this planar base. The wavelength conversion member 30 can thus be continuous, substantially planar and with a substantially uniform thickness. With this geometry for the wavelength conversion member 30, a small angle 56 of side emission passes though this continuous wavelength conversion member 30 and converts to white color light, which covers the dark areas formed by the gaps between the light emitting diodes (LEDs) 28. The uniformity is better than in the prior art light emitting device 10A-10F. From the top view, the emitting window appears as a continuous lighting area instead of as separate light spots. In addition, with the continuous, substantially planar and uniform wavelength conversion member 30, the color can be more uniform than in the prior art light emitting device 10A-10F. The light shaper 34 performs two major functions. First, the light shaper 34 can block yellow light form big angle side emission 58 (more yellow because of longer light path though phosphor). This makes the color more uniform and consistent. Second, the light shaper 34 provides desired shape edge of emitting windows and limits the emitting size.

Figure 12A:
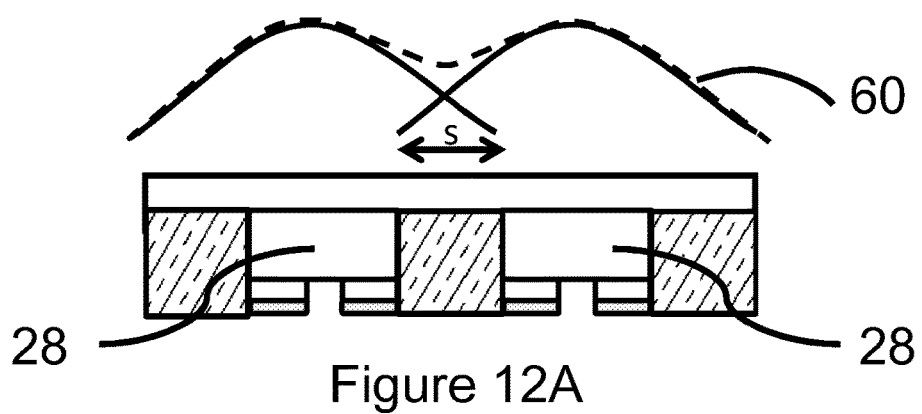
FIG. 12A is a schematic cross sectional view illustrating further operational characteristics of a light emitting device constructed in accordance with the preferred embodiment of the present disclosure in which the LED are spaced to produce acceptable light uniformity.
Figure 12B:
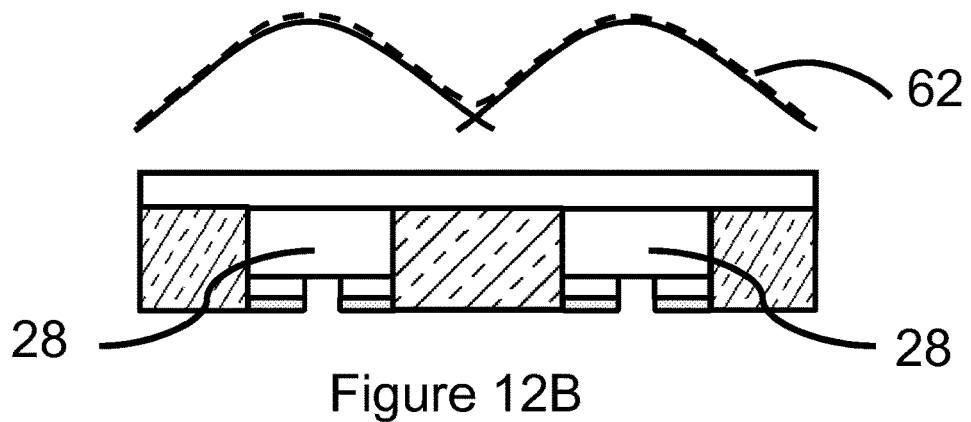
FIG. 12B is a schematic cross sectional view illustrating operational characteristics of a light emitting device in which the LED are spaced "s" too far apart to produce acceptable light uniformity.
Figure 12C:
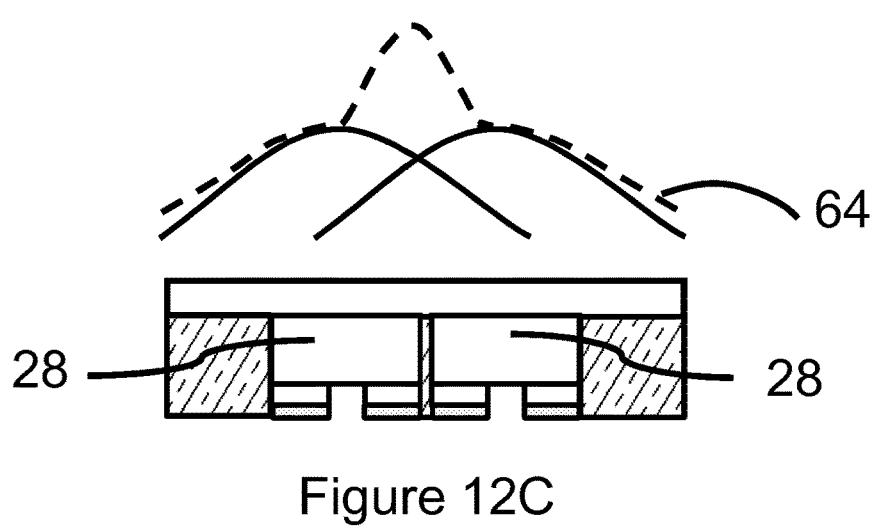
FIG. 12C is a schematic cross sectional view illustrating operational characteristics of a light emitting device constructed in accordance with the preferred embodiment of the present disclosure in which the LED are spaced "s" too close to produce acceptable light uniformity.

Referring to FIGS. 12A-12C, further characteristics of the light emitting device 20 are illustrated. As shown in FIG. 12A, a spacing (s) between the light emitting diodes (LEDs) 28 of between 5 µm to 100 µm provides uniformity of light intensity as represented by uniform light wave 60. As shown in FIG. 12B, a spacing (s) of greater than 100 µm resulting in much lower light intensity between the two spaced LEDs as represented by light wave 62. As shown in FIG. 12C, a spacing (s) of less than 5 µm resulting in higher light intensity between the two spaced LEDs, provides substantially uniformity of light intensity as represented by substantially non-uniformity of light intensity as represented by light wave 64.

Figure 13A:
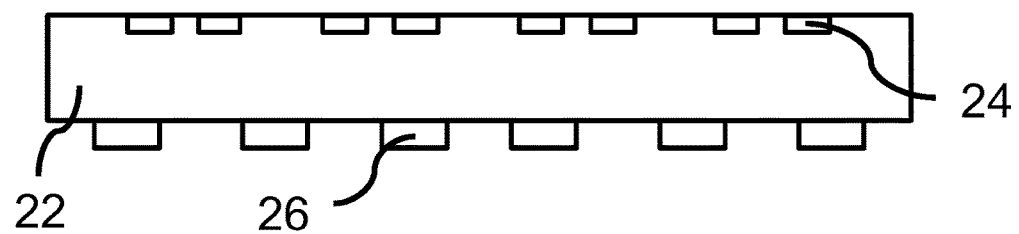
FIGS. 13A-13E are schematic cross section view showing steps in a method for fabricating the light emitting device of the present disclosure.

Referring to FIGS. 13A-13E and 14A-14B, steps in a method for fabricating the light emitting device 20 are illustrated. Initially, as shown in FIG. 13A, the circuitry substrate 22 can be provided with the electrodes 24 in a selected pattern. The electrodes can comprise a bondable material such as Cu, Al, Au or Ag. The circuitry substrate 22 can also include internal conductors (not shown) that electrically connect the electrodes 24 to the terminal contacts 26 (FIG. 9B). The terminal contacts 26 (FIG. 9B) can be formed at any stage of the fabrication process using a suitable technique.

Figure 13B:
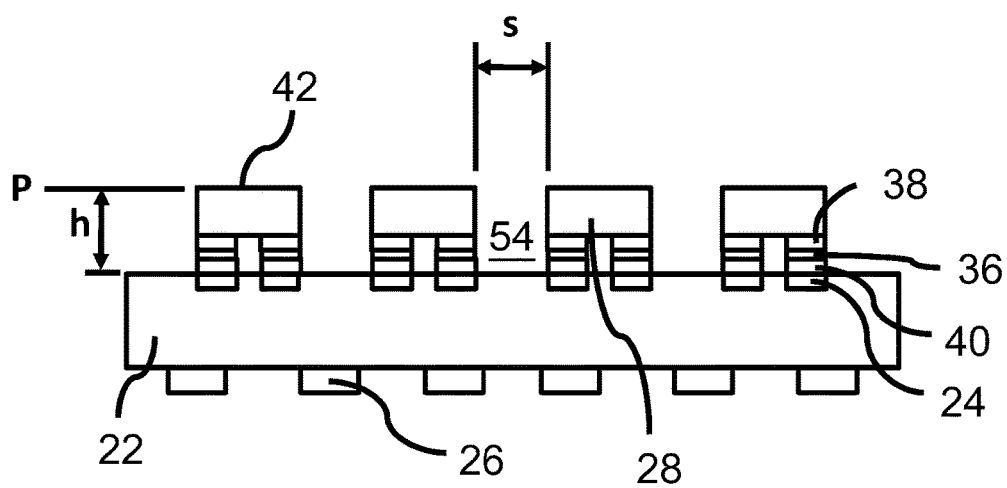

Next as shown in FIG. 13B, the light emitting diodes (LEDs) 28 are bonded to the electrodes 24 using a suitable bonding process to form the die attach layer 40. One suitable comprises soldering with the die bonding layers 40 formed of eutectic solder. In addition, the bonding step is performed such that the planar top surfaces 42 of the light emitting diodes (LEDs) 28 are coplanar to each other and to a selected plane P. In addition, the height "h" of each planar top surface 42 measured from the surface of the circuitry substrate 22 is substantially equal, and the spaces 54 between the light emitting diodes (LEDs) 28 have a spacing "s" that is between 5 µm to 150 µm.

Figure 13C:
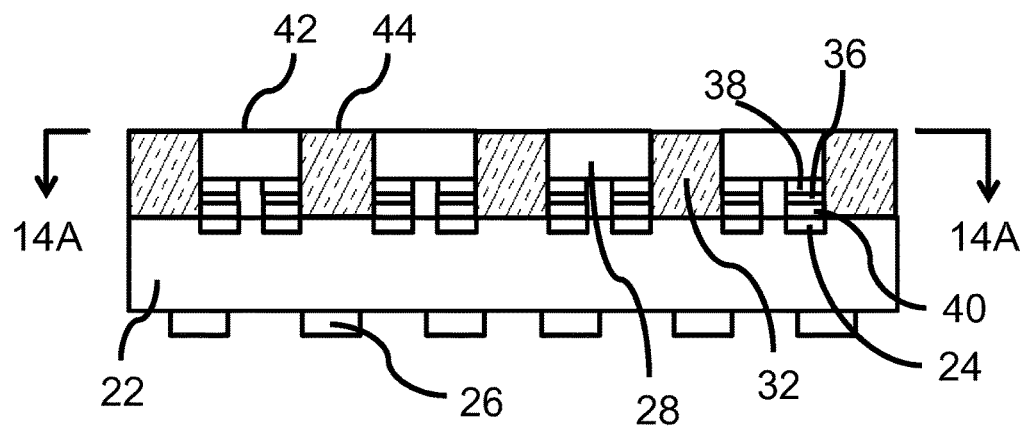
Figure 14A:
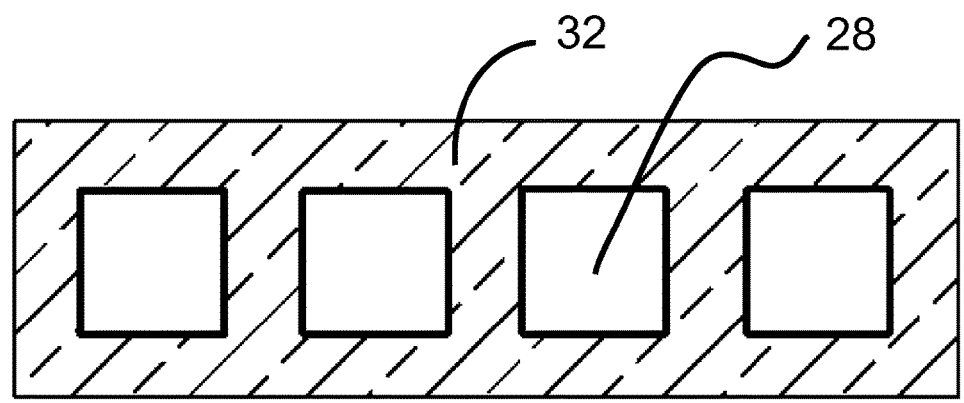
FIG. 14A is a schematic cross sectional view taken along section line 14A-14A of FIG. 13C.

Next as shown in FIG. 13C, the planarized layer 32 is formed on the circuitry substrate 22 and in the spaces 54 between the light emitting diodes (LEDs) 28. As shown in FIG. 14A, the planarized layer 32 can have a peripheral outline that matches the footprint of the light emitting device 20. The planarized layer 32 can comprise a polymer powder as previously described deposited in viscous form and cured. In addition, the curing and deposition processes can be controlled to form the planarized layer 32 with the planar support surface 44 that is coplanar to the planar top surfaces 42 of the light emitting diodes (LEDs) 28. In addition, another planarizing process, such as chemical mechanical planarization (CMP), polishing or grinding can be used to provide a precise planarity for the planarized layer 32.

Figure 13D:
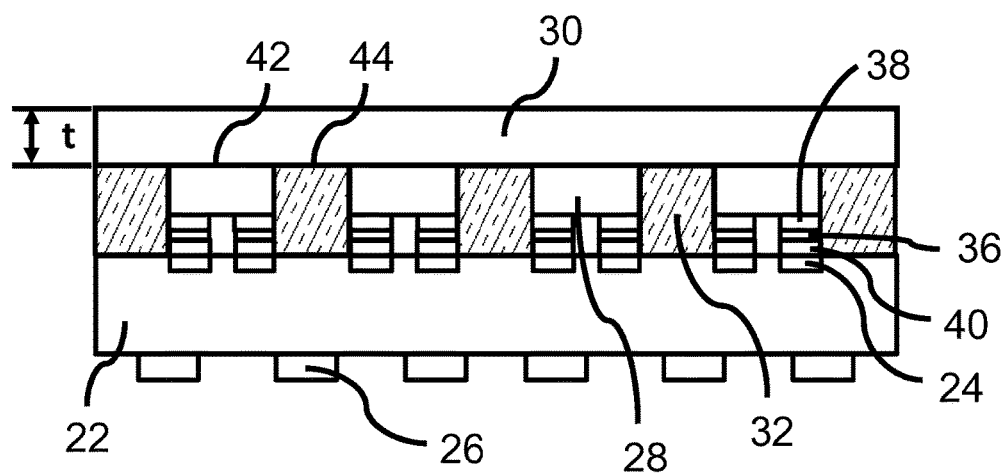

Next as shown in FIG. 13D, the wavelength conversion member 30 is formed on the planar support surface 44 of the planarized layer 32. The wavelength conversion member 30 can be formed by depositing and curing a material as previously described to the thickness "t". Alternately, the wavelength conversion member 30 can be formed separately and then bonded to the planar support surface 44 of the planarized layer 32 using a transparent adhesive (not shown).

Figure 13E:
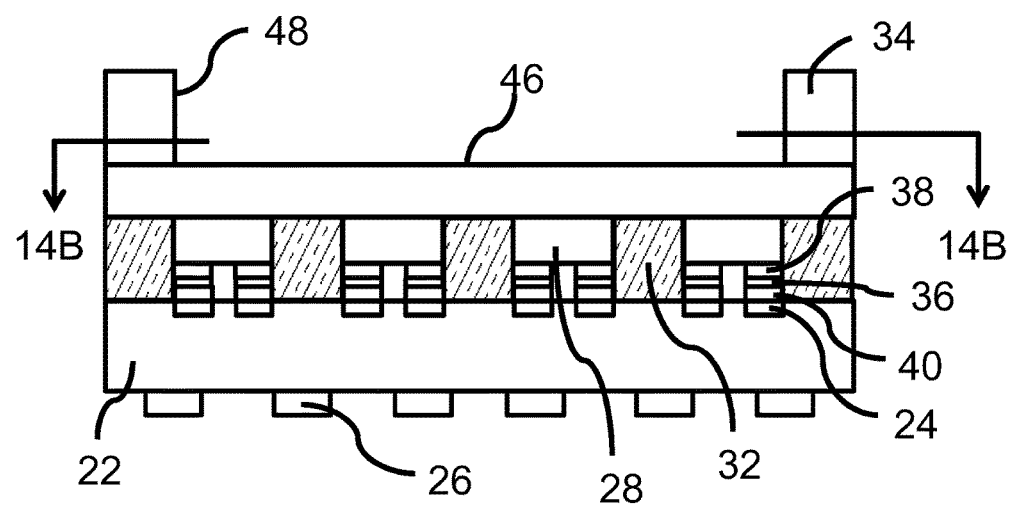
Figure 14B:
FIG. 14B is a schematic cross sectional view taken along section line 14B-14B of FIG. 13E.

Next as shown in FIG. 13E, the light shaper 34 can be formed on the planar outer major surface 46 of the wavelength conversion member 30 by depositing and curing a material as previously described. Suitable molds can also be used to form the light shaper 34 to a desired thickness and with the inside edges 48 having a desired geometry. In addition, as shown in FIGS. 14A and 14B, the light shaper 34 can have a peripheral outline that matches the footprint of the light emitting device 20 (FIG. 11) and the peripheral outline of the wavelength conversion member 30 (FIG. 11). If desired, multiple light emitting devices 20 can be fabricated on a panel containing multiple circuitry substrate 22, which is then diced into individual devices using semiconductor wafer fabrication techniques.

Thus the disclosure describes an improved light emitting device and method of fabrication. While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

What is claimed is:

1. A light emitting device comprising:
a circuitry substrate having a surface and a plurality of electrodes;
a plurality of spaced light emitting diodes (LEDs) bonded to the electrodes on the circuitry substrate and having a plurality of planar top surfaces;
a wavelength conversion member having parallel major planar surfaces and a uniform thickness (t), the wavelength conversion member covering the planar top surfaces of the light emitting diodes (LEDs); and
a planarized layer supporting the wavelength conversion member on the circuitry substrate having a planar support surface that is coplanar to the planar top surfaces of the light emitting diodes (LEDs) and parallel to the major planar surfaces of the wavelength conversion member,
the planarized layer and the light emitting diodes (LEDs) having a matching height h measured from the surface of the circuitry substrate.

2. The light emitting device of claim 1 further comprising a light shaper on a top major planer surface of the wavelength conversion member forming emitting windows for electromagnetic radiation transmitted through the wavelength conversion member.

3. The light emitting device of claim 2 wherein the light emitting diodes (LEDs) comprise a plurality of flip chip light emitting diodes (FCLEDs) in a spaced array having a spacing of between 1 μm to 150 μm.

4. The light emitting device of claim 3 wherein the uniform thickness (t) of the wavelength conversion member is between 5 μm to 200 μm.

5. The light emitting device of claim 4 wherein the planarized layer comprises a powder mixed polymer.

6. The light emitting device of claim 5 wherein the light shaper comprises a powder mixed polymer.

7. A light emitting device comprising:
a circuitry substrate having a surface and a plurality of electrodes and terminal contacts in a selected configuration in electrical communication with one another;
a plurality of spaced flip chip light emitting diodes (FCLEDs) bonded to the electrodes on the circuitry substrate in a spaced array having planar top surfaces;
a wavelength conversion member having parallel major surfaces and a uniform thickness (t), the wavelength conversion member covering the planar top surfaces of the flip chip light emitting diodes (FCLEDs);
a planarized layer supporting the wavelength conversion member on the circuitry substrate having a planar support surface that is coplanar to the planar top surfaces of the flip chip light emitting diodes (FCLEDs) and parallel to the major planar surfaces of the wavelength conversion member,
the planarized layer and the flip chip light emitting diodes (FCLEDs) having a matching height h measured from the surface of the circuitry substrate, such that all electromagnetic radiation emitted by the flip chip light emitting diodes (FCLEDs) passes through the uniform thickness "t" of the wavelength conversion member; and
a light shaper on the wavelength conversion member forming emitting windows for the electromagnetic radiation transmitted through the wavelength conversion member.

8. The light emitting device of claim 7 wherein the terminal contacts on the circuitry substrate comprise contacts for electrical engagement with a printed circuit board.

9. The light emitting device of claim 7 wherein the flip chip light emitting diodes (FCLEDs) emit electromagnetic radiation in a blue wavelength range, the wavelength conversion layer converts the electromagnetic radiation to a yellow wavelength range, and an output light beam comprises white light.

10. The light emitting device of claim 7 wherein the wavelength conversion member comprises a layer of a phosphor compound deposited on a polymer base layer.

11. The light emitting device of claim 7 wherein the planarized layer comprises a material selected from the group consisting of $TiO_2$, $SiO_2$, $Al_2O_3$, $Ta_2O_5$, C, MgO, insulation coated materials, silicone, epoxy, gel, glue, photosensitive resist, and non-photosensitive resist.

12. The light emitting device of claim 7 wherein the light shaper comprises a material selected from the group consisting of $TiO_2$ mixed silicone, $TiO_2$ mixed epoxy, $TiO_2$ mixed gel, $TiO_2$ mixed glue, $SiO_2$ mixed silicone, $SiO_2$ mixed epoxy, $SiO_2$ mixed gel, $SiO_2$ mixed glue, carbon mixed silicone, carbon mixed epoxy, carbon mixed gel, carbon mixed glue, $Al_2O_3$ mixed silicone, $Al_2O_3$ mixed epoxy, $Al_2O_3$ mixed gel, $Al_2O_3$ mixed glue, $Ta_2O_5$ mixed silicone, $Ta_2O_5$ mixed epoxy, $Ta_2O_5$ mixed gel, and $Al_2O_3$ mixed glue.

13. The light emitting device of claim 7 wherein the uniform thickness (t) of the wavelength conversion member is between 5 μm to 200 μm.

* * * * *